(12) United States Patent
Birch et al.

(10) Patent No.: US 8,421,651 B2
(45) Date of Patent: Apr. 16, 2013

(54) MOBILE PHONE WITH IMPROVED KEYBOARD SCANNING AND COMPONENT REDUCTION AND METHOD

(75) Inventors: Magnus Birch, Malmo (SE); Kaj Ullen, Bjarred (SE)

(73) Assignees: Sony Corporation, Tokyo (JP); Sony Mobile Communications AB, Lund (SE)

(*) Notice: Subject to any disclaimer, the term of this patent is extended or adjusted under 35 U.S.C. 154(b) by 1003 days.

(21) Appl. No.: 12/432,145

(22) Filed: Apr. 29, 2009

(65) Prior Publication Data

US 2010/0277348 A1 Nov. 4, 2010

(51) Int. Cl.
*H03K 17/94* (2006.01)
*H03M 11/00* (2006.01)

(52) U.S. Cl.
USPC .............................................. 341/22; 341/20

(58) Field of Classification Search ............ 341/20, 341/22
See application file for complete search history.

(56) References Cited

U.S. PATENT DOCUMENTS

| 6,538,582 | B1* | 3/2003 | Lin et al. .................... 341/22 |
| 7,197,284 | B2* | 3/2007 | Brandt et al. ................ 455/78 |
| 8,099,142 | B2* | 1/2012 | Zhu et al. .................... 455/575.1 |
| 2004/0087295 | A1* | 5/2004 | Abbasi et al. ................ 455/277.1 |
| 2004/0214530 | A1* | 10/2004 | Brandt et al. ................ 455/90.1 |
| 2005/0057515 | A1* | 3/2005 | Bathiche ...................... 345/168 |
| 2005/0118961 | A1* | 6/2005 | Uittenbogaard ............. 455/73 |
| 2006/0026650 | A1* | 2/2006 | Kim et al. .................... 725/62 |
| 2006/0145853 | A1* | 7/2006 | Richards et al. ............. 340/572.1 |
| 2006/0223570 | A1* | 10/2006 | Zhu et al. .................... 455/550.1 |
| 2007/0224948 | A1* | 9/2007 | Hartenstein et al. ........ 455/101 |
| 2008/0316066 | A1* | 12/2008 | Minato et al. ................ 341/24 |
| 2009/0098917 | A1* | 4/2009 | Zhu et al. .................... 455/575.5 |

FOREIGN PATENT DOCUMENTS

JP 2009 245026 10/2009

OTHER PUBLICATIONS

International Search Report corresponding to PCT/IB2009/007298, mailed on Apr. 13, 2010.
Written Opinion corresponding to PCT/IB2009/007298, mailed Apr. 13, 2010.
International Preliminary Report on Patentability, corresponding to PCT/IB2009/007298, filed on Oct. 29, 2009.

* cited by examiner

*Primary Examiner* — Albert Wong
*Assistant Examiner* — Amine Benlagsir
(74) *Attorney, Agent, or Firm* — Renner, Otto, Boisselle & Sklar, LLP

(57) ABSTRACT

Apparatus and method to detect one or more keys of a mobile wireless electronic device that have received an activating input, e.g., have been pressed, interrogates simultaneously several keys of a group of keys to reduce time required to detect which of the keys is pushed to provide inputs to the electronic device. The keys are arranged in a two dimensional matrix that facilitates organized interrogation of the keys. Resistors are used in providing a decoupling effect with respect to the antenna function of the wireless electronic device.

18 Claims, 7 Drawing Sheets

MOBILE PHONE WITH IMPROVED KEYBOARD SCANNING AND COMPONENT REDUCTION AND METHOD

TECHNICAL FIELD OF THE INVENTION

The technology of the present disclosure relates generally to portable electronic devices and methods and, more particularly, to mobile phone portable electronic devices with improved keyboard scanning and component reduction and methods.

BACKGROUND

Mobile wireless electronic devices are becoming increasingly popular. For example, mobile telephones, portable computers, personal digital assistants (PDAs), portable media players and portable gaming devices are now in wide-spread use. In addition, the features associated with certain types of electronic devices have become increasingly diverse. To name a few examples, many electronic devices have cameras, text messaging capability, Internet browsing capability, electronic mail capability, video playback capability, audio playback capability, image display capability and handsfree headset interfaces.

Many mobile wireless electronic devices have keyboards (also sometimes referred to as keypads) that are used to input information, e.g., telephone numbers, names of contacts, email addresses, Internet websites, addresses, domain names, etc., alphanumeric text, and so on. Two exemplary keyboards are those with one or more keys (sometimes referred to as buttons) and those formed by areas of a touch sensitive display on which indicia, e.g., alphanumeric letters, numbers and symbols may be displayed. Circuitry of such keyboards may be arranged in a matrix format, e.g., a two dimensional matrix of x rows and y columns.

To avoid interfering with antenna functions of mobile wireless electronic devices, inductors have been used to decouple keys of the keyboard from the antenna. Inductors are relatively expensive, which is a disadvantage to using them in such electronic devices.

Electrostatic discharge (ESD) devices have been used to protect circuitry in electronic devices. ESD devices have capacitance, which may increase time required for circuits of the electronic device to stabilize due to resistance capacitance (RC) time constants. Relatively inexpensive ESD devices tend to have relatively large capacitance and, thus, increase such time constant. In contrast, relatively lower capacitance ESD devices reduce such time constants but disadvantageously are more expensive than the relatively higher capacitance ESD devices.

Time consuming methods have been used in the past to determine which key(s) are pressed, as it has been necessary to allow adequate time for circuitry to stabilize due to RC circuit time constants. Those methods consume processor operational time such that the processor is unavailable for other functions or to carry out other functions and also may waste power while the circuitry is in a sense actively waiting for circuitry to stabilize. Also, ghosting or the sensing of a ghost key, e.g., the false appearance of a key being pressed when the key is not being pressed, may occur if adequate time is not provided for circuit components of a mobile wireless electronic device to stabilize.

SUMMARY

According to an aspect of the invention, resistive components, e.g., resistors, are used in keyboard circuitry to provide decoupling between the keyboard and an antenna of a wireless electronic device without requiring decoupling inductors.

According to another aspect, keys of a keyboard matrix, which includes resistors in the keyboard circuitry to provide decoupling with respect to an antenna of a wireless electronic device, are sampled in respective groups to determine which key(s) has (have) been operated, while allowing time for circuit stabilizing.

Another aspect relates to reducing the processor time required to sample keys of a keyboard matrix to determine which key(s) has (have) been operated.

Another aspect relates to enhancing accuracy and/or speed of detecting operation of key(s) of a keyboard matrix as inputs to a mobile wireless electronic device.

An aspect of the invention relates to a method of scanning a keyboard matrix that has a plurality of keys that are selectively operable to respective conditions to provide respective electrical signals, including attempting to draw a the plurality of keys substantially simultaneously to a specified condition; sampling at least a group of the keys substantially simultaneously to determine whether any of the keys is at a condition different from the specified condition, and wherein the number of keys in the group is less than the number of keys in the plurality of keys; and repeating the attempting step for the plurality of keys and the sampling step for at least a further group of keys, and wherein the further group of keys includes at least one key different from the first mentioned group of keys and wherein the number of keys in the further group is less than the number of keys in the plurality of keys.

In accordance with another aspect, the mentioned drawing to a specified condition includes drawing to a relatively high voltage level.

In accordance with another aspect, the sampling includes drawing the group of keys to a relatively low voltage level, and determining whether any of the keys of the group is at a high voltage level as a representation of being selectively operated.

In accordance with another aspect, the keyboard matrix includes a two dimensional x by y matrix of keys, and the sampling includes drawing to a relatively low voltage level a group of keys represented in one dimension and at one location in the other dimension of the two dimensional matrix and determining whether any of the keys in such other dimension is at other than a relatively low voltage level.

According to another aspect the method further includes sensing the operation of at least one key to provide an interrupt signal to initiate the attempting, sampling and repeating steps.

According to another aspect, the circuitry includes respective keys that have a resistance and capacitance time constant function, and the method further includes providing a wait period of time between said attempting and sampling steps to allow substantial stabilizing of electrical signals occurring during the attempting step.

In accordance with another aspect, the providing a wait period includes providing a wait period of a duration from about one millisecond to about four milliseconds.

According to another aspect, the repeating includes repeating the attempting and sampling steps until the attempting and sampling steps have been carried out for all of the plurality of keys.

According to another aspect, the keyboard is included in a wireless communication device having a processor, and the method further includes at least partly controlling by the processor the steps of attempting, sampling and repeating until all of the plurality of keys have been scanned, and wherein the sum of incremental time of operation of the processor to carry out the steps of attempting, sampling and repeating to complete a scan of all of the plurality of keys, excluding any wait time provided while signals are stabilizing, is less that the total time for attempting, sampling, repeating and any wait times to complete a scan of all the plurality of keys, and further including permitting the processor to go to a rest state or to carry out another function while not carrying out the steps of attempting, sampling and repeating.

According to another aspect, the keyboard matrix is coupled to logic circuitry, and the attempting and sampling include receiving output signals from the logic circuitry and the sampling further includes providing to the logic circuitry input signals representative of respective selectively operated keys.

According to another aspect, the keyboard matrix is included in a mobile phone wireless portable communication device, and the method further including pressing one or more of the plurality of keys to carry out functions of the mobile phone.

According to another aspect, at least part of the keyboard matrix is in proximity to an antenna of a wireless portable communication device, and the method further including decoupling interaction between at least one or more keys from interference with antenna operation by directing signals associated with said at least one or more keys in a resistor and capacitor circuit.

In accordance with another aspect of the invention, a keyboard apparatus for a wireless communication device that has an antenna function includes a plurality of keys selectively operable to provide respective inputs for the wireless communication device, circuitry coupled to respective keys and configured to provide respective signals to the keys to determine whether a key is operated to provide an input for the wireless communication device, and at least one resistor that is in the circuitry coupled to at least one of the keys and is configured to provide decoupling with respect to the antenna function of the wireless communication device.

According to another aspect, the keys are coupled in a circuit forming a two dimensional x by y matrix.

According to another aspect, the circuitry is configured to draw to a relatively low voltage level a group of keys represented in one dimension of the matrix and at one location in the other dimension of the matrix and the circuitry is further configured to determine whether any of the keys in such other dimension is at other than a relatively low voltage level.

According to another aspect, each key has two electrically conductive terminals and a movable member responsive to selective operation of the key to provide electrical connection between said two electrically conductive terminals, and the at least one resistor comprising one resistor coupled electrically to one of the terminals and one resistor coupled electrically to a second terminal, at least one of the resistors being coupled with a capacitor to provide a resistor capacitor circuit to smooth changes in the signals occurring in response to opening or closing a circuit between the terminals by the movable member to reduce affect on the antenna function.

According to another aspect, the circuitry includes logic operable to scan the keys by attempting to draw a the plurality of keys substantially simultaneously to a specified condition, sampling at least a group of the keys substantially simultaneously to determine whether any of the keys is at a condition different from the specified condition, and wherein the number of keys in the group is less than the number of keys in the plurality of keys, repeating the attempting step for the plurality of keys and the sampling step for at least a further group of keys, and wherein the further group of keys includes at least one key different from the first mentioned group of keys and wherein the number of keys in the further group is less than the number of keys in the plurality of keys.

According to another aspect, the keyboard is included in a wireless communication device having a processor and a program storage device containing operative code for operating the processor and the keyboard, and wherein the operative code is configured to respond to an interrupt signal caused by selective operation of at least one key to control the processor to carry out the steps of attempting, sampling and repeating until all of the plurality of keys have been scanned, and wherein the sum of incremental time of operation of the processor to carry out the steps of attempting, sampling and repeating to complete a scan of all of the plurality of keys, excluding any wait time provided while signals are stabilizing, is less that the total time for attempting, sampling, repeating and any wait times to complete a scan of all the plurality of keys, and wherein the processor is permitted to go to a rest state or to carry out another function while not carrying out the steps of attempting, sampling and repeating.

Another aspect of the invention relates to a computer readable medium including a computer program including instructions, which when executed on a processor cause the processor to perform scanning of a keyboard matrix to sense selective operation of one or more keys of the keyboard matrix, including attempting to draw a plurality of keys substantially simultaneously to a specified condition; sampling at least a group of the keys substantially simultaneously to determine whether any of the keys is at a condition different from the specified condition, and wherein the number of keys in the group is less than the number of keys in the plurality of keys; repeating the attempting step for the plurality of keys and the sampling step for at least a further group of keys, and wherein the further group of keys includes at least one key different from the first mentioned group of keys and wherein the number of keys in the further group is less than the number of keys in the plurality of keys.

These and further aspects and features of the invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

Many aspects of the invention can be better understood with reference to the following drawings. The components in the drawings are not necessarily to scale, emphasis instead being placed upon clearly illustrating the principles of the present invention. To facilitate illustrating and describing some parts of the invention, corresponding portions of the drawings may be exaggerated in size, e.g., made larger in relation to other parts than in an exemplary device actually made according to the invention. Elements and features depicted in one drawing or embodiment of the invention may be combined with elements and features depicted in one or more additional drawings or embodiments. Moreover, in the drawings, like reference numerals designate corresponding parts throughout the several views and figures; and reference numerals that include a prime character, e.g., 1', represent same or similar parts that are identified by the same unprimed reference numeral.

DETAILED DESCRIPTION OF EMBODIMENTS

Embodiments will now be described with reference to the drawings.

In the present document, embodiments are described primarily in the context of a mobile wireless electronic device in the form of a portable radio communication device, such as the illustrated mobile telephone(s). It will be appreciated, however, that the exemplary context of a mobile telephone is not the only operational environment in which aspects of the disclosed systems and methods may be used. Therefore, the techniques described in this document may be applied to any type of appropriate electronic device, examples of which include a mobile telephone, a mobile wireless electronic device, a media player, a gaming device, a computer, a pager, a communicator, an electronic organizer, a personal digital assistant (PDA), a smartphone, a portable communication apparatus, etc.

As used herein, the term "portable communication device" includes portable radio communication equipment. Portable communication device and mobile communication device may be used synonymously, as may the terms "portable" and "mobile." The terms "portable radio communication equipment" and "portable wireless communication equipment," which may be referred to below as a portable phone (or telephone), a portable device, a portable radio terminal or a portable terminal, includes all electronic equipment, including, but not limited to, mobile telephones, pagers, communicators, e.g., electronic organizers, smartphones, personal digital assistants (PDAs), or the like. While the present invention is being discussed with respect to portable communication devices, it is to be appreciated that the invention is not intended to be limited to portable communication devices, and can be applied to any type of electronic equipment capable of being used for voice and/or data communication.

As will be appreciated, the invention may be used with portable telephones, other telephones, personal digital assistants (PDA), computers, other communication devices, etc.; for brevity, the invention will be described by way of example with respect to portable telephones (sometimes referred to herein as "mobile phone" or the like and/or to "wireless communication device," but it will be appreciated that the invention may be used with other communication devices.

Figure 3:
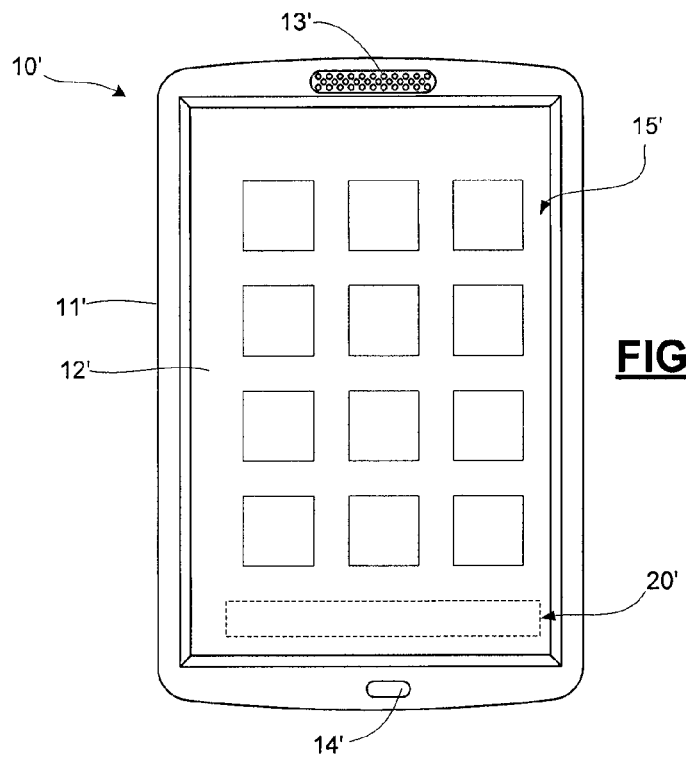
FIG. 3 is a schematic illustration of a mobile wireless electronic device in the form of a mobile phone that has a graphically displayed keyboard provided on a touch sensitive display.

The portable communication device will be referred to below as a mobile phone. However, as was mentioned above, reference to "mobile phone" includes various other devices, such as, for example, those mentioned above. In outward appearance, for example, as is illustrated in FIGS. 1 and 3, the mobile phone is of one type of design or style; however, the features of the invention, as are described in further detail below, may be used in other types of mobile phones, such as those that include cases that open and close, and various other mobile phones that currently exist or may come into existence in the future.

Figure 1:
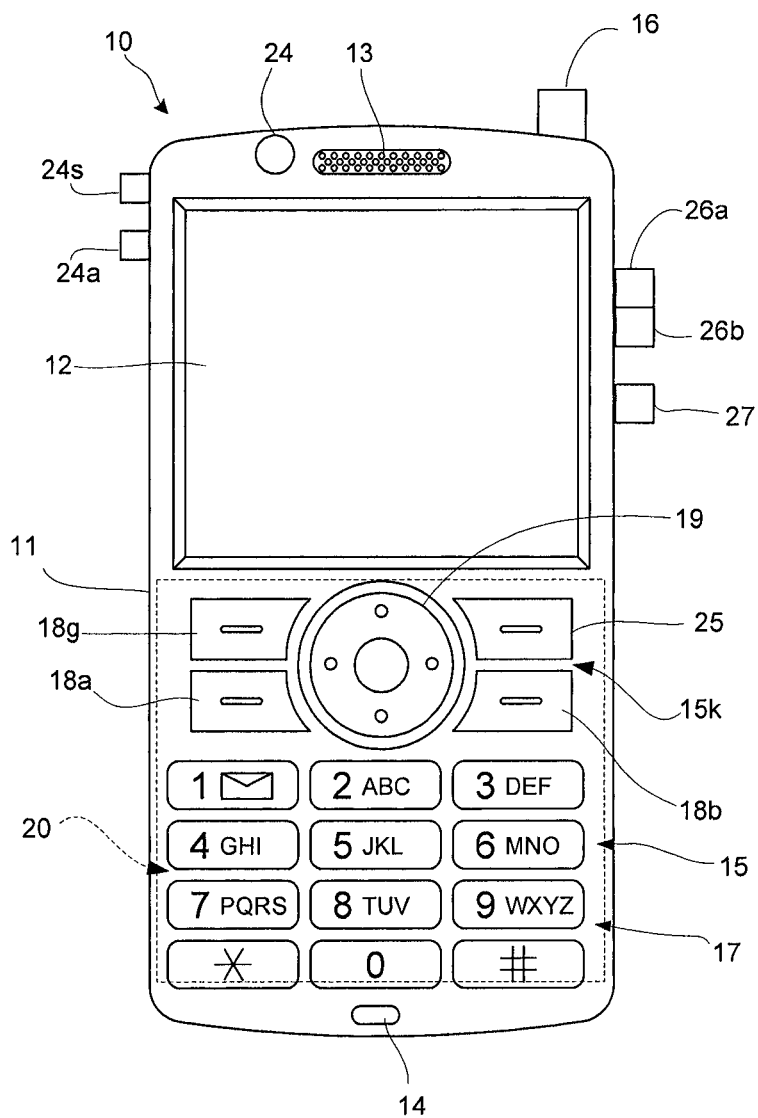
FIG. 1 is a schematic illustration of a mobile wireless electronic device in the form of a mobile phone that has a fixed keyboard with a plurality of selectively operable keys.

Referring in detail to the drawings, and initially to FIG. 1, a portable communication device, e.g., a mobile phone, in accordance with an embodiment of the present invention is illustrated generally at 10. The mobile phone 10 includes a case 11, display 12, speaker 13, microphone 14, keyboard 15, and an antenna 16. The keyboard 15 includes a number of alphanumeric/dialing keys 17 (sometimes referred to in the art as a dialing keypad). The keyboard 15 also includes a number of soft keys 18a, 18b at and a navigation and/or selecting key 19, e.g., a rocker key that can rock up, down, left, or right and be pressed at the center. The keys of the keyboard are collectively designated 15k; the keys 15k may be on one or more printed circuit boards or may be otherwise mounted or positioned in or on the case 11 and be accessible to be selectively operated (sometimes referred to herein as pressed, pushed, slid, etc). The keys 15k of the keyboard 15 may be exposed at the front, back, side, top, bottom, etc. of the case 11 to be selectively operated to enter data, to cause a function, etc. with respect to the mobile phone 10. For example, selective operation of one or more keys by a user may provide usual functions of a mobile phone, such as, inputting telephone numbers, inputting alphanumeric text and numbers, inputting operating functions, answering, ending or initiating a phone call, moving a cursor or scrolling and/or selecting data, icons (e.g., graphical user interface (GUI) icons), etc. that are shown on the display 12, etc. Additionally, the display 12 may be a touch sensitive display that may be touched or pressed by a finger, a stylus, etc. to provide inputs to the mobile phone 10.

Figure 4:
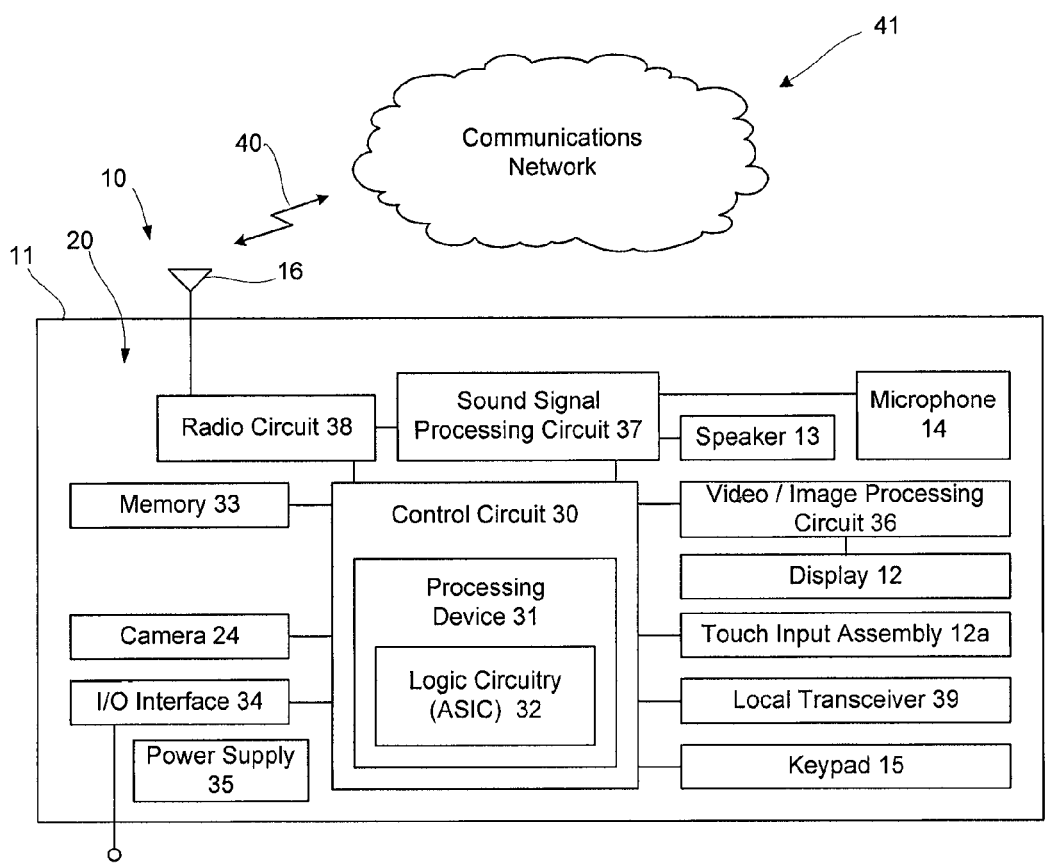
FIG. 4 is a schematic illustration of operating circuitry for a mobile phone.

Operating circuitry 20, which is shown in dash lines in FIG. 1 and is described below with respect to FIG. 4, is in the case 11. The operating circuitry 20 may include a battery power supply, one or more printed circuit boards, traces on the printed circuit boards, mountings and electrical connections for respective keys of the keyboard 15 and the display 12, and so on. The speaker 13, microphone 14, and antenna 16 are electrically connected to the operating circuitry 20 and are appropriately mounted with respect to the case and/or one or more circuit boards of the operating circuitry.

As is described in greater detail below, at least some of the keys 15k may be arranged electrically in a matrix, e.g., a two dimensional matrix of x rows by y columns. The keys are checked or scanned in groups to determine which of the keys have been pressed or otherwise selectively operated. Such group checking may be performed relatively quickly.

Figure 2:
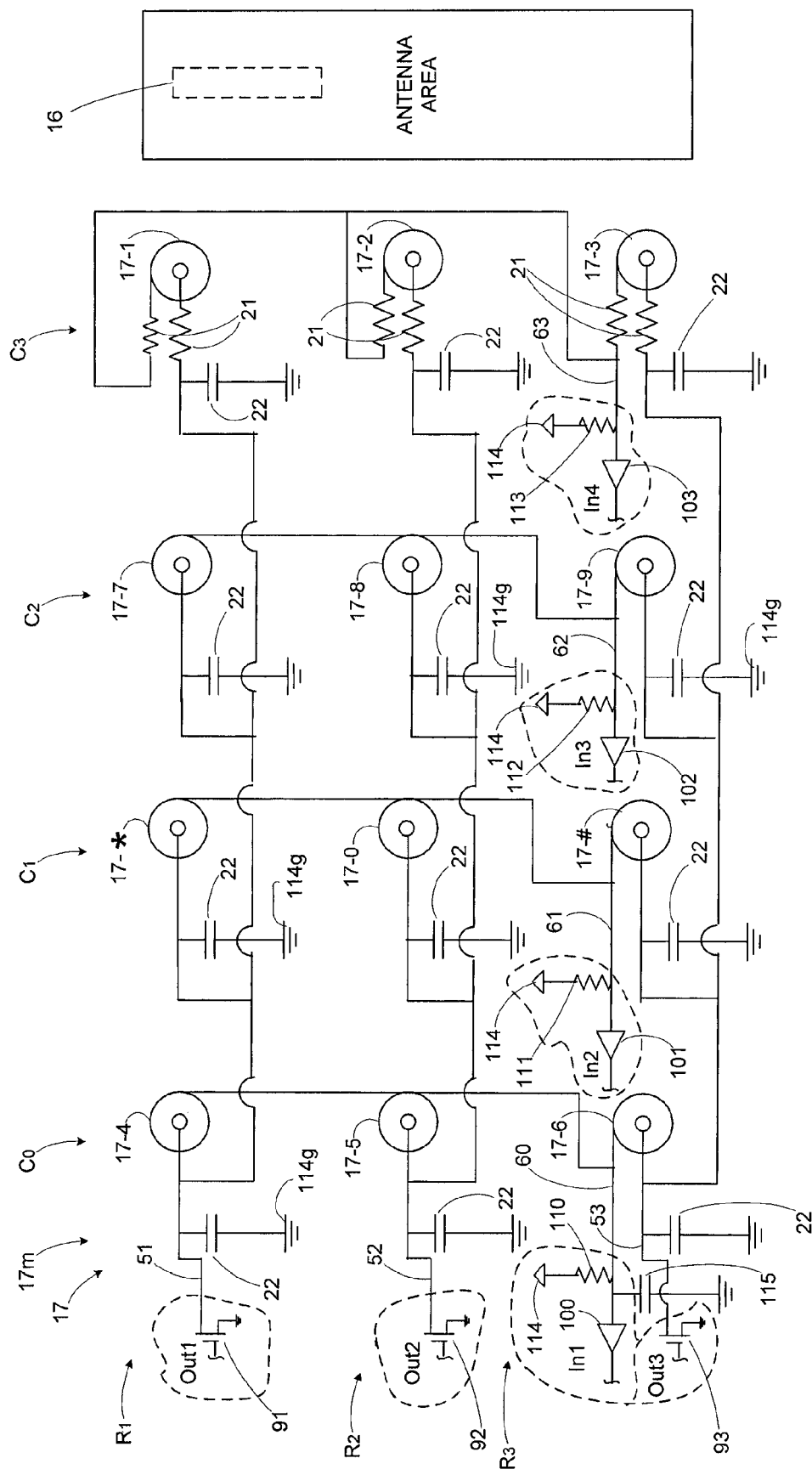
FIG. 2 is a schematic circuit diagram of keyboard circuitry with decoupling capability using resistors in accordance with an embodiment of the invention.

With reference to both FIGS. 1 and 2, costs for components of the mobile phone 10 may be reduced by using resistors 21 (FIG. 2), rather than inductors, to provide decoupling with respect to the antenna 16 and, thus, to avoid interfering with antenna function when respective keys 15k are selectively operated, e.g., pressed. Costs for components of the mobile phone 10 also may be reduced by using ESD devices 22 (FIG. 2) that have relatively high capacitive loading function in the keyboard circuitry because such devices are relatively less expensive than ESD devices that provide a relatively low capacitive load. The time required for the operating circuitry 20 to determine, e.g., to read out, which of the keys 15k are selectively operated may be reduced by simultaneously providing to respective groups of keys readout signals, e.g., analogous to pinging respective groups of keys, and by simultaneously receiving from groups of keys the results of such pinging. Such time reduction by the operating circuitry 20 to read out which keys are pressed may reduce power requirements of the mobile phone and/or may free some processing time for other functions.

Turning to FIG. 2, the alphanumeric/dialing keys 17 of the keyboard 15 of the mobile phone 10 are illustrated schematically. The keys 15k are arranged in a two dimensional matrix, which is a portion 17m of a larger keyboard matrix that is described further with respect to FIG. 5. The alphanumeric/dialing keys 17 shown in FIG. 2 are included as a portion of the keyboard matrix of FIG. 5. The alphanumeric/dialing keys 17 are individually designated in FIG. 2 by reference numerals 17 plus a suffix portion that represents the typical key label. The portion of the keyboard matrix that includes the alphanumeric/dialing keys 17 has three rows designated $R_1$, $R_2$, $R_3$ and four columns $C_0$, $C_1$, $C_2$, $C_3$. For example, the four keys in matrix row R1 respectively are designated 17-4, 17-\*, 17-7 and 17-1 of the keyboard 15 shown in FIG. 1, and so on for the corresponding keys labeled "4," "*," "7," and "1" among the alphanumeric/dialing keys 17, and similarly for the keys in the other respective rows and columns of the keyboard matrix portion 17m illustrated in FIG. 2.

In FIG. 2 the keyboard matrix has three connections to receive signals from logic circuitry in the operating circuitry, one for the group of keys in each of the respective rows $R_1$, $R_2$, $R_3$. Those connections are to output lines or circuits of logic circuitry in the operating circuitry 20, and they are labeled, respectively, Out1, Out2, Out3. The keyboard matrix also has four connections, one for the group of keys in each of the respective columns $C_0$, $C_1$, $C_2$, $C_3$, to input lines or circuits of logic circuitry in the operating circuitry 20; these connections are labeled, respectively, In1, In2, In3, In4.

The capacitive load of ESD devices 22 in the circuits coupled to respective keys of the alphanumeric/dialing keys 17 may be relatively high, as will be describe further below. Resistors 21 are in circuit with the alphanumeric/dialing keys that are near enough to the antenna 16 in the mobile phone 10 case 11 to tend to interfere with antenna function, e.g., to load the antenna as the key is selectively operated, e.g., pressed to close a circuit between terminals (contacts) of the key. The resistors 21 in combination with the capacitive load of the ESD devices 21 and possibly also in combination with other resistance and capacitance, e.g., parasitic capacitance between traces on the printed circuit board having circuitry for the keys 17 and/or on which keys may be mounted and/or other sources of capacitance, may tend to slow the growth or sharpness of voltage changes, e.g., voltage spikes, that occur when a key is selectively operated. Slowing those spikes and/or reducing the magnitude of the spikes reduces or eliminates the mentioned interference with antenna function.

Use of relatively inexpensive ESD devices 22 reduces the cost of the mobile phone 10, but the relatively high capacitance of those ESD devices increases the time required for circuitry that is associated with a selectively operated key to stabilize, for example, as compared to use of relatively more expensive, relatively low capacitance ESD devices. For use in decoupling function, as mentioned herein, using relatively inexpensive resistors 21 instead of relatively expensive inductors in respective circuitry of keys that may interfere with antenna function when selectively operated also reduces the cost of the mobile phone 10, but also further increases the time for the circuitry to stabilize. However, as is described just below and elsewhere herein, group interrogation and reading out of keys 17 (and others of the keys 15k) reduces the time required for interrogation and reading out and reduces or eliminates the affect of increased time constants due to the just-described capacitive and resistive loading of the circuitry.

For example, continuing to refer to FIG. 2, signals can be provided to groups of the keys in respective rows $R_1$, $R_2$, $R_3$ and signals representing whether a respective key has been selectively operated can be read out from groups of the keys in respective columns C0, C1, C2, C3. Using logic to ping, e.g., to send to, a group of keys an input signal, e.g., to send interrogation signal to such keys, and using logic to read out or to determine which key(s) provide an output representing selective operation of the key(s) when pinged, information can be obtained to identify the selectively operated key(s). The mobile phone may use that information in its operation in various conventional ways or in ways that may developed in the future. The time required to obtain the information from groups of keys may be less than the time required to obtain the information from individual keys one at a time.

Briefly referring to FIG. 3, a mobile phone 2' is illustrated. The mobile phone 10' is similar to the mobile phone 10 in structure and function, except there is no separate keyboard 15 in the mobile phone 10'. Rather, a keyboard 15' may be provided the mobile phone 10' by displaying images of respective keys and/or some other graphical user interface (GUI) on the display. A user may touch such a shown key, icon of a GUI, etc. to provide inputs to the operating circuitry 20' of the mobile phone 10'.

The mobile phones 10, 10' may include additional keys (shown in FIG. 1), such as, for example, an on/off key 25, volume control keys 26a, 26b and a WiFi on/off key 27. Such keys, for example, may be separate mechanical keys used in the mobile phone 10 or may be shown on the display 12' of the mobile phone 10'. The on/off key 25 may turn the mobile phone 10 on and off; the volume control keys 26a, 26b may be operated to adjust volume of the speaker 13, and the WiFi key 27 may turn on or off the wireless internet connecting function of the mobile phone. The mobile phones 10, 10' may include more or fewer keys than those described and shown herein.

The case 11, 11' (also referred to sometimes as a housing) may be of "brick" shape or configuration, e.g., as is illustrated in the drawings. It also will be appreciated that the mobile phones 10, 10' may be of another format, design or form factor, such as, for example, those that sometimes are referred to as clam shell configuration or flip phones, phones with movable keyboards that slide out or rotate relative to from a main housing portion, or some other shape or design that may exist or come into existence in the future.

Turning to FIG. 4, operating circuitry 20 of the wireless electronic device 10 (mobile phone) is shown in the case 11. The operating circuitry 20 includes a control circuit 30 that controls the various functions of the mobile phone, for example. The control circuit 30 includes, for example, a processing device 31, e.g., a microprocessor or other processor, and logic circuitry 32, e.g., an application specific integrated circuit (sometimes referred to elsewhere herein as ASIC) or other logic devices, circuitry and/or software. For brevity, such logic circuitry 32 will be referred to below as the ASIC.

As an example, the connections Out1, Out2, Out3 and In1, In2, In3, In4 mentioned above between the keyboard matrix portion 17m, which is illustrated and described with respect to FIG. 2, and logic circuitry may be direct or indirect connections with the ASIC 32.

A memory 33 is coupled to the control circuit 30. The memory may include computer programming, instructions, application software, etc. for operating the control circuit 30 and the mobile phone 10 and also may include storage capability to store contact information, telephone numbers, application programs, email correspondence, etc. as is conventional for mobile phones, for example. An input/output interface 34 may provide connections to external circuitry to receive new application software, data, and so on. For example, contact information stored in the memory 33 and contact information stored on a remote computer may be synchronized, new application programs may be loaded or existing application programs may be updated, etc., via the input/output interface 34. The input/output interface 34 may provide other functions, as are conventional for mobile phones and as may come into existence in the future. A power supply 35 provides power to the operating circuitry 20. The power supply may be a rechargeable battery, for example, and may include a connection to an external power supply to recharge the power supply 35.

In the operating circuitry 20 the keyboard 15 is coupled to the control circuit 30, as is shown. A user of the mobile phone 10, for example, may provide inputs to the control circuit 30 via the keyboard 15 and/or via the touch input assembly 12a, which is the touch responsive portion and associated circuitry of the display 12 (or display 12' of mobile phone 10'). Furthermore, the control circuit 30 is coupled via a video/image processing circuit 36 to the display 12 to cause the display to provide various images, such as, for example, alphanumeric lists and/or other information, icons of a graphical user interface, movies, still picture, etc. The speaker 13 and microphone 14 are coupled to the control circuit 30 via a sound signal processing circuit 37. The sound signal processing circuit 37 also is coupled to a radio circuit 38, which in turn is coupled to the antenna 16 to provide signals for transmission by the antenna and to receive signals from the antenna, which signals represent, for example, sounds received from the microphone 14 or provided to the speaker 13, for example, in conventional manner. Control of the sound signal processing circuit 37 and of the speaker 13, microphone 14 and radio circuit 38 is provided by the control circuit 30 also in conventional manner, for example. The camera 24 also may be controlled by the control circuit 30, for example, to take pictures, obtain video images, etc., and those pictures and images may be stored in the memory 33, used for various purposes, shown on the display 12, etc., as is conventional. Additionally, a local transceiver 39 may be included in the operating circuitry to control and/or to carry out various transmitting and receiving functions via the control circuit 30 and the other operative portions of the operating circuitry 20. For example, as is represented by arrow 40, signals maybe transmitted and received by and between the antenna 16 and a communications network 41. The communications network 41 may provide for telephone voice and/or data communications, internet or other network communications, etc. Communications also may be carried out directly from one mobile phone to another using, for example, a "walkie-talkie" type of function.

Figure 5:
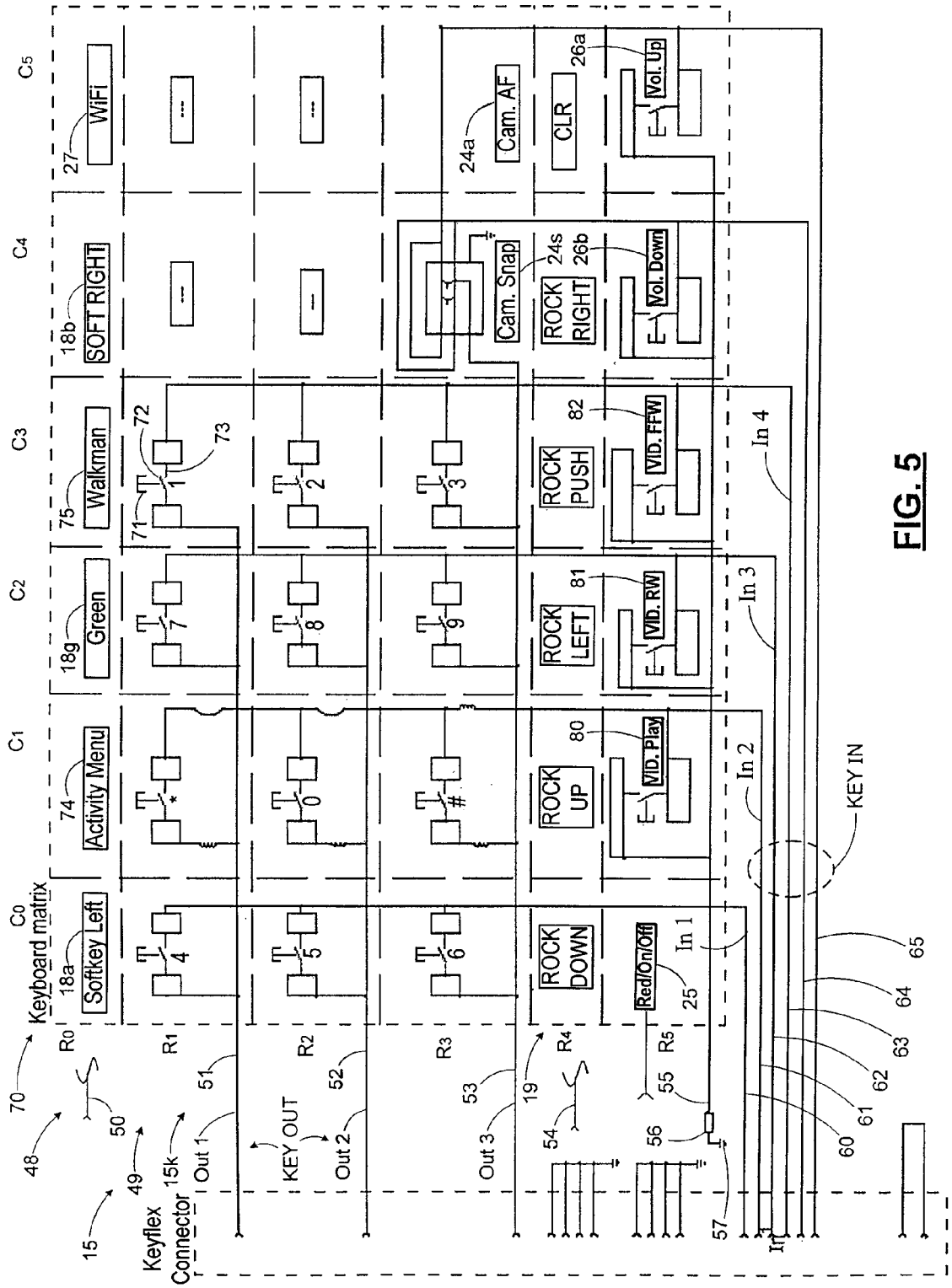
FIG. 5 is a schematic circuit diagram of a keyboard and associated circuitry connections to output circuitry and input circuitry of logic circuitry in the operating circuitry of the mobile phone.

Referring to FIG. 5, an exemplary keyboard 15 used in the mobile phone 10 of FIG. 1 is illustrated. Keyboard functions similar to those described below with respect to the keyboard 15 of FIG. 5 also may be used in a mobile phone 10' that has a keyboard shown on a touch screen. For brevity, though, the exemplary keyboard 15 will be described with respect to the mobile phone 10 of FIG. 1 and the operating circuitry 20 (FIG. 4).

In FIG. 5 a number of input and output connections 48 are shown. The connections 48 extend between keyboard circuitry generally indicated at 49 and the logic circuitry (ASIC) 32 of the control circuit 30 in the operating circuitry 20 (FIG. 4).

The connections 48 include KEYOUT connections 50-54. The KEYOUT connections 50-54 are outputs from the ASIC 32 that supply signals to the keyboard 15 to carry out the various functions described further below. An additional KEYOUT connection 55 is coupled via a resistor 56 to a source of ground reference potential 57. The KEYOUT connections 51-53 correspond to the connections Out1, Out2, Out3, which are described above with respect to the keyboard matrix portion 17m shown in FIG. 2.

The connections 48 also include six connections referred to as KEYIN 60-65. The KEYIN connections 60-65 are connected to the ASIC 32 to provide input signals or information to the ASIC. That information is used by the processing device 31 to understand which, if any, of one or more keys of the keyboard 15 has/have been selectively operated by a user, e.g., by the user pressing or otherwise operating one or more of the keys 15k of the keyboard 15 of the mobile phone 10 (FIG. 1). The KEYIN connections 60-63 correspond to the connections In1, In2, In3, In4, which are described above also with respect to the keyboard matrix portion 17m shown in FIG. 2.

The keyboard 15 is organized electrically in a two dimensional matrix format, sometimes referred to as an x-y matrix. The matrix format refers to the electrical circuitry arrangement of respective keys. The physical locations of the keys 15k need not be in such an organized matrix, as is evident by location of key with respect to the case 11, as is shown in FIG. 1, for example. The matrix dimensions x and y are whole numbers. In the illustrated embodiment the keyboard 15 of FIG. 5 is a five by six matrix based on the five KEYOUT connections 50-54 and the six KEYIN connections 60-65 that are coupled to the ASIC 32. For convenience of the following description, the keyboard 15 will be referred to as a keyboard matrix 70 having rows $R_0$ through $R_4$ and having columns $C_0$ through $C_5$. The sixth row $R_5$ of keys is the Out6 connection to ground rather than to the ASIC 32.

Referring to row $R_1$ of the keyboard matrix 70, four keys are shown, respectively in columns $C_0$ through $C_3$. Those keys represent the alphanumeric and symbol characters 4, *, 7, 1, respectively. The key 71, which represents the alphanumeric key with the digit 1 shown in the alphanumeric/dialing keys 17 portion of the keyboard 15 in FIG. 1, includes a switch member 72 and associated terminals or contacts, one of which is schematically illustrated at 73. Although not illustrated, it will be appreciated that a typical key, such as that identified as 71, of a mobile phone may include two or more terminals that are in spaced-apart relation to each other and are aligned with a flexible contacting member, sometimes referred to as a dome. The dome is resilient, can be deformed by pressing it against the terminals, and at least part of the dome or a member associate with the dome is electrically conductive to connect electrically with the terminals and, thus, to connect them electrically to each other. When the pressure pressing the dome against the terminals is relieved, the connection between the terminals is opened. It will be appreciated that the keys are selectively operable, e.g., by a user pressing the key to deform the electrically conductive dome to connect terminals associated with the key. Such selective operation provides signals to the control circuit 30 (FIG. 4), and those signals may be used to carry out various functions and to provide data input to the operating circuitry 20.

Several keys are shown in FIG. 5 as blocks or rectangles for convenience of illustration. However, it will be appreciated that such keys may be similar to the key 71 or may be some other type of selectively operable key.

The selective operating of a key, e.g., closing a circuit by pressing a key or opening a circuit by releasing a key, may tend to cause a relatively sharp rise or fall in an electrical signal that would create electromagnetic interference with the antenna function of the mobile phone. The nearer a key is located to the antenna 16 of the mobile phone, the more likely will be the occurrence of such interference and degrading of antenna function and, thus, of communication operation. As is described further below with respect to FIG. 6, decoupling inductors have been used in the past to reduce such an affect on antenna function of a mobile phone. However, as is described above with respect to FIG. 2, decoupling resistors 51 are used in accordance with an embodiment of the present invention. The decoupling resistors and inductors are not shown in FIG. 5.

The keys $15k$ in the keyboard matrix 70, as is illustrated in FIG. 5, are in the exemplary row and column relation shown in the drawing. Those locations in the matrix do not necessarily correspond with the physical locations of the respective keys in the mobile phone 10. For example, the twelve alphanumeric/dialing keys 17 that are shown in FIG. 1 are at the respective exemplary row and column locations in the keyboard matrix 70 of FIG. 5. The arrangement of keys in the keyboard matrix may be coordinated with logic in the ASIC 32 for efficiently providing of signals to the keys and decoding information, e.g., signals received from the keys, to be used in connection with operating the mobile phone 10. Appropriate logic circuitry, e.g., the ASIC 32 and/or one or more other devices or circuits and/or software providing appropriate logic, may be designed by a person having ordinary skill in the art to accommodate the functions and operational features of the mobile phone 10 based on signals received on the respective KEYIN lines 60-65. Thus, the example of keyboard matrix 70 illustrated in FIG. 5 has the alphanumeric/dialing keys 17 located in rows $R_1$, $R_2$, $R_3$ and columns $C_0$, $C_1$, $C_2$ and $C_3$, and the respective designations of those alphanumeric keys are illustrated in FIG. 5. For example, in row $R_1$ of the keyboard matrix 70 the designated keys 4, *, 7, 1 are located. In row $R_2$ the keys 5, 0, 8, 2 are shown. In row $R_3$ of the keyboard matrix the keys 6, #, 9, 3 are illustrated.

Additional keys and/or their functions are shown in the keyboard matrix, such as, for example, in row $R_0$ are the left soft key 18a, an activity menu key 74 (not shown in FIG. 1), a so-called "green" key, which represents initiating or answering a telephone call (shown at 18g in FIG. 1), a "WALKMAN" key 75, a soft key right 18b, and a "WiFi" key 27. The keys in the rows $R_1$ and $R_2$ of the keyboard matrix 70 are mentioned above; also, as is illustrated in FIG. 5, there are several blank spaces at the right side of the keyboard matrix in rows $R_1$ and $R_2$. In row $R_3$ are several of the alphanumeric/dialing keys mentioned above and also a camera shutter key 24s and a camera automatic focus key 24a.

Six keys are shown in row $R_4$ of the keyboard matrix 70. Five of those six keys, respectively, in columns $C_0$ through $C_4$ are associated with the navigation key 19 (FIG. 1), for example, a rocker key. The five keys associated with such rocker key include rocking down, rocking up, rocking left, pushing the center of the key, and rocking right, as are labeled in FIG. 5. Such rocking and pushing may close respective switches to be used for various functions, e.g., depending on what is shown on the display 12 or otherwise, as is conventional. Also in keyboard matrix row $R_4$ at column $C_5$ is a "clear" key that may be used to reset the mobile phone 10 without having to turn off the mobile phone or to remove the battery.

The bottom row $R_5$ of the keyboard matrix 70 shown in FIG. 5 includes in the respective columns $C_0$ through $C_5$ the following keys: the red on/off key 25, which also may be used to end a telephone call; video play, rewind, and fast forward keys 80, 81, 82; and volume down and volume up (decrease or increase volume) keys 26b and 26a.

The keys of the mobile phone 10 may be arranged on a single support or mounting structure, e.g., printed circuit board, or they may be mounted respectively on more than one support structure or e.g., more than one printed circuit board. The keys may be mounted on or otherwise with respect to the case 11 of the mobile phone 10 and be electrically connected to various circuits of the operating circuitry 20. Other techniques may be used for physically positioning or for mounting the respective keys as is known in the art and may be developed in the future.

In using the various keys of the keyboard matrix 70, one or more keys may be pressed or otherwise operated to provide signals on the KEYIN lines 60-65 to the ASIC 32 to operate the mobile phone 10. Operation of the mobile phone may be carried out in conventional manner or in ways that come into existence in the future. It will be appreciated that although the keyboard matrix 70 of FIG. 5 includes the illustrated keys, the features of the invention may be used with a smaller number of keys or a larger number of keys than those illustrated. Appropriate logic may be provided to decode signals from such keys using the operating circuitry 20, for example.

In the interest of brevity, further description of the invention is directed to the alphanumeric/dialing keys 17 illustrated in FIG. 1 and also shown at keyboard matrix 70 rows $R_1$-$R_3$ and columns $C_0$-$C_3$. The other keys of the keyboard 15 in the arrangement of the keyboard matrix 70 may be operated in a manner similar to that described with respect to the alphanumeric/dialing keys 17.

Briefly referring back FIG. 2 to facilitate coordinating the illustrated keyboard matrix portion 17m with the keyboard matrix 70 of FIG. 5, the KEYOUT connections or lines 51, 52, 53 to receive signals from the ASIC 32 are illustrated. The ASIC 32 may include respective transistors or other switches 91, 92, 93 that selectively tend to draw or cause to be drawn the connections or lines 51, 52, 53, respectively, to relatively high or relatively low voltage levels, as will be described below with respect to the method of carrying out the invention, as is illustrated schematically in FIG. 10.

The KEYIN connections or lines 60, 61, 62, 63 also are shown in FIG. 2. Such lines are coupled to respective amplifiers 100, 101, 102, 103 in the ASIC 32 to provide signals to the ASIC that may be decoded to identify which of the keys 17, for example, (or which of the keys $15k$ of the entire keyboard 15) is being selectively operated by a user. The ASIC 32 also includes internal pull-up resistors 110, 111, 112, 113 coupled to the respective KEYIN input connections or lines 60-63, respectively. The pull-up resistors are coupled at 114 to a voltage source, e.g., provided by the power supply 35; and the pull-up resistors provide appropriate voltage levels on the lines depending on whether or not a respective one of the keys is selectively operated to close a circuit between the contacts thereof.

A capacitor 115 is shown in the circuitry associated with the keyboard matrix portion 17m in FIG. 2. The capacitor 115 is representative of parasitic capacitance and/or other capacitance that may load the keyboard matrix portion 17m and similarly in the keyboard matrix 70. The location of the capacitor 115 is exemplary only; the effect of parasitic capacitance also may be experienced at other locations in the circuitry of the keyboard matrix, although to avoid cluttering the drawing such other examples of capacitive loading are not shown.

Capacitors 22 are shown in the circuitry associated with the keyboard matrix portion 17m in FIG. 2. The respective capacitors 22 represent the sum of ESD devices, parasitic capacitance and extraneous capacitive load of or as experienced by respective circuits. The parasitic capacitance is the sum of capacitance between signals and ground and internal capacitance of inputs and outputs. If all other capacitance were zero or were so small as not to affect operation of the circuit to which a capacitor 22 is coupled, the respective capacitor 22 may represent an ESD device. It is likely that parasitic capacitance exists and that extraneous capacitive load also exists; and in such case the capacitors represent the capacitance of an ESD device, if used, and also parasitic capacitance, e.g., the sum of the capacitance of an ESD device and parasitic capacitance.

Another capacitor 115 is shown in the circuit of FIG. 2. The capacitor 115 is representative of internal capacitance of logic circuitry, e.g., ASIC 32, and/or other circuitry that is coupled to the keyboard matrix portion 17m, for example.

The number and placement of the capacitors 22 and the number and placement of the capacitor 115 in the circuitry of the keyboard matrix 17m and/or circuitry associated with the keyboard matrix, e.g., the logic circuitry, may be different from the illustration of FIG. 2. All possible capacitance is not illustrated in order to avoid cluttering the drawings. Also, it will be appreciated that the keyboard matrix portion 17m is exemplary of the full keyboard matrix 70, and, therefore, other portions of the keyboard matrix 70 may have capacitance and capacitors similar to those represented at 22 and 115 that are illustrated and described with respect to the keyboard matrix portion of FIG. 2.

Of interest is the total capacitance on the various lines of the keyboard matrix 70 (discussed above by way of example with respect to the keyboard matrix 17m of FIG. 2). The total capacitance of a respective circuit together with resistance of the respective circuit provides a resistance capacitance (RC) time constant that is to be considered.

As was mentioned above, the resistive and capacitive loading of the circuitry of the keyboard matrix and the resulting time constants caused by such loading require time for the circuitry to stabilize so that accurate determinations of which of the keys is selectively operated. However, the method of operation of the keyboard matrix, e.g., as is described below with respect to FIG. 8, tends to reduce the time needed to determine which of the keys is selectively operated.

Summarizing such operation with respect to the keyboard matrix portion 17m of FIG. 2, when none of the keys 17 of the keyboard matrix portion 17m has been pushed for a given period of time, the circuit of the keyboard matrix portion is at a rest state with all KEYOUT lines 51, 52, 53 at a relatively low voltage level (sometimes referred to as signal level), as they are coupled to a source of ground reference potential by conduction in the transistors 91, 92, 93 of the ASIC. Meanwhile, the KEYIN lines 60, 61, 62, 63 are at a relatively high voltage level on account of the voltage provided via the pull-up resistors 110, 111, 112, 113 from the voltage source coupled at 114. The voltage source coupled at 114 may be provided directly or indirectly, e.g., from voltage level adjusting circuitry, filters, etc., from the power supply 35.

Reference to relatively high voltage level may be, for example, approximately seventy percent (70%) or greater of the supply voltage, e.g., as may be provided at 114. Reference to relatively low voltage level may be, for example, approximately thirty percent (30%) or less than the supply voltage, e.g., as may be provided at 114. These percentages of voltage levels are exemplary; the relatively high and relatively low voltage levels may be different than equal to or greater than 70% and/or equal to or less than 30% of the voltage at 114 or the voltage provided from a different source or location, as may be desired. There should be adequate difference between the relatively high and relatively low voltage levels for the circuitry to function as described herein.

When one of the keys is pushed, at least one of the KEYIN lines 60-63 will go to a relatively low voltage level from the relatively high voltage level just prior to pushing of the key. This relatively low voltage level is provided to the ASIC as an indication to the operating circuitry 30 to carry out logic functions and steps to determine which one or more of the keys are pushed. For example, if key 17-0 were pushed to close a circuit between the contacts thereof, a connection is made from KEYOUT line 52, which is coupled to ground reference potential via transistor 92 of the ASIC 32 to the input line 61 drawing that line to a relatively low voltage level.

Under control of the processor 31, logic circuitry of the ASIC 32 and/or software (e.g., computer code), for example, provided from the memory 33, all KEYOUT lines 51, 52, 53 are drawn to a relatively high voltage level by turning off the transistors 91, 92, 93, since the transistors interrupt connection to ground 114g. Only several of the illustrated ground terminals or connections are labeled 114g in FIG. 2 to avoid cluttering the drawing.

After the circuitry of the keyboard matrix portion 17m has stabilized, for example, over of from about 1 millisecond to about four milliseconds (or other satisfactory time period), the first of the KEYOUT lines 51 is drawn to a relatively low signal level by turning on the transistor 91. All of the KEYIN lines 60-63 then are sampled when the voltages on them are expected to be low. For example, since none of the group of keys 17-4, 17-*, 17-7, 17-1 in row $R_1$ is pushed, the drawing of the KEYOUT line 51 to a relatively low signal level will not cause changes in any of the KEYIN lines 60-63. The KEYOUT line 51 then is drawn to a relatively high signal level again. This process is repeated such that the next KEYOUT line is drawn to a relatively low signal level and all of the KEYIN lines 60-63 are sampled, and so on, until all of the KEYOUT lines have been drawn to a relatively low signal level and the KEYIN lines are sampled as just described.

Since the pushed key 17-0 is in the group of keys in the second row $R_2$ of the keyboard matrix portion 17m, the drawing of the output line 52 to a relatively low signal level by turning on the transistor 92 to its conductive state, conduction through the key 17-0 will draw down the signal level on KEYIN line 61 to a relatively low signal level. This condition of a relatively low signal level on the KEYIN line 61 while the second KEYOUT transistor 92 is drawing the group of keys in the second row $R_2$ will be an indication that key 17-0 is pushed.

It will be appreciated that the above-described method may be used to detect one or more keys that are pushed sequentially or that are pushed simultaneously. The logic circuitry in the ASIC 32 together with operation of the processor 31 and appropriate software may be used to decode, decipher or determine which of the keys is pushed so that appropriate action can be taken by the operating circuitry, e.g., to store and then to dial a telephone number, to create and then to transmit a message, to take and to store a photograph or video, etc.

Figure 6:
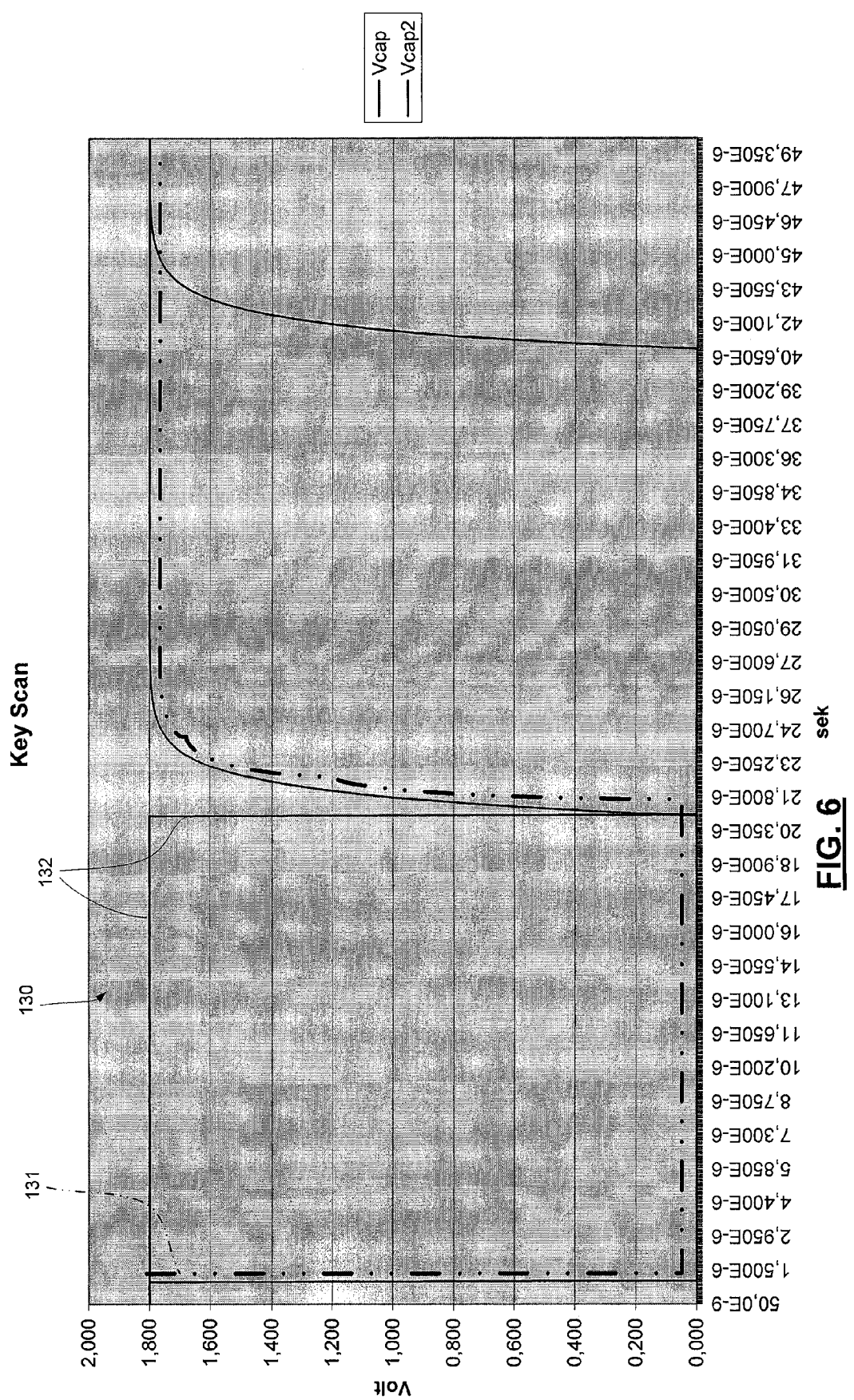
FIGS. 6 and 7 are respective waveform diagrams.

Briefly referring to FIG. 6, a graph 130 shows substantially idealized curves 131, 132 representing signal levels (voltage levels) on respective capacitors, associated with respective keys of the keyboard matrix portion 17m, e.g., the respective capacitive loads 22 (such as, for example, ESD devices, parasitic capacitance, etc., as is mentioned above) shown in FIG. 2. The signal levels go to relatively high and relatively low levels nearly instantaneously. For example, the curve 131 may represent the voltage level of capacitor 22 associated with key 17-4 as the KEYOUT line 51 is drawn between relatively low and relatively high signal levels. The time required to go from a relatively high to a relatively low level is very short, whereas the time required to go from a relatively low to a relatively high voltage level is slightly longer. Therefore, the time required for the circuitry of the keyboard matrix portion 17m to stabilize in such an optimized condition, e.g., with relatively little capacitive loading, is relatively short, and operation to determine which of the keys is pushed will not take much time.

Figure 7:
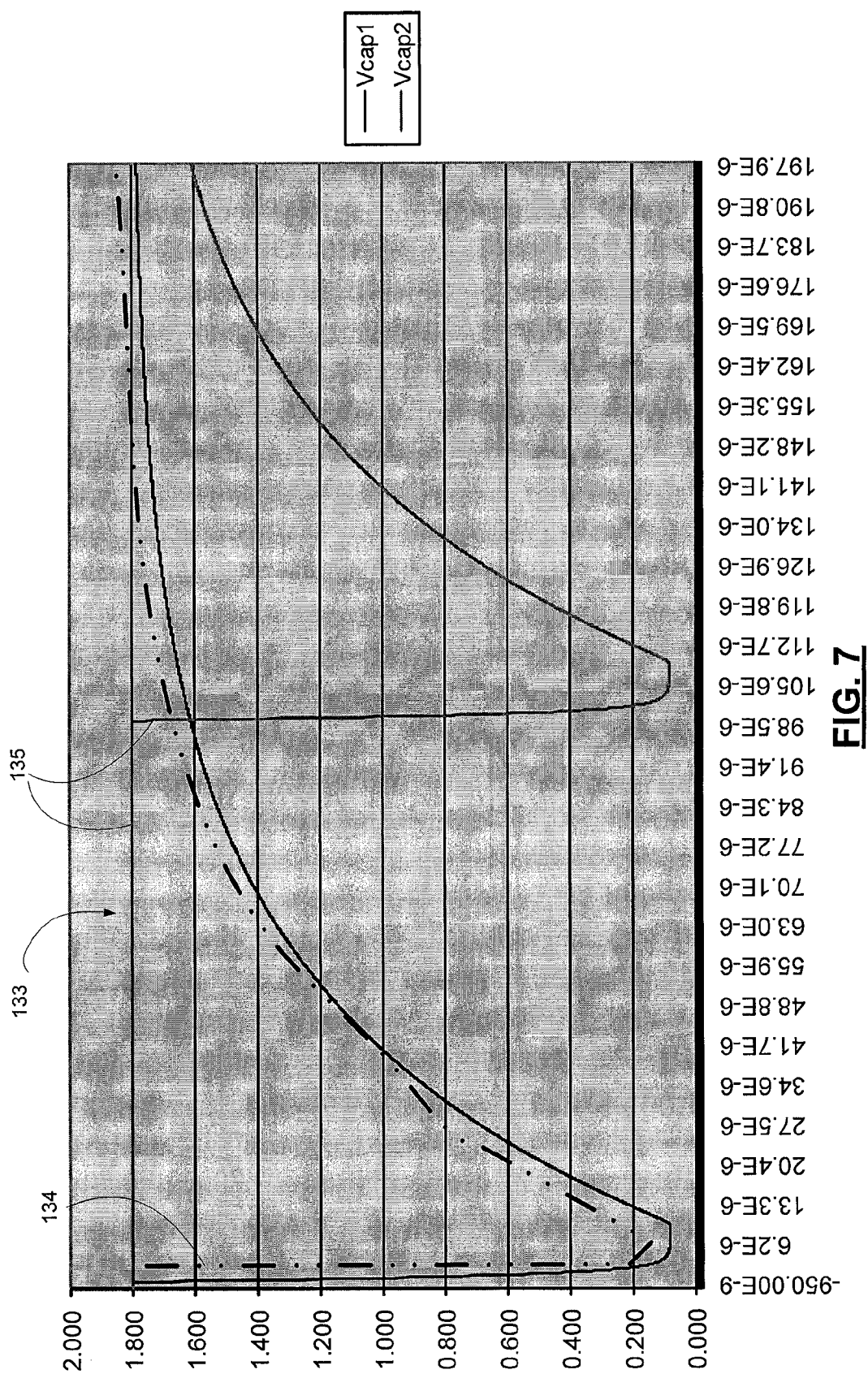

However, with reference to the graph 133 of FIG. 7, using the present invention with relatively larger capacitive loading, e.g., by the ESD devices 22 (such as relatively inexpensive ESD devices that usually have larger capacitance than relatively more expensive ESD devices), etc., and the resistance provided by the decoupling resistors 21, the timing for signal levels going between relatively high and relatively low levels across respective capacitors 22, for example, associated with a respective keys will look like the curves 134, 135. The curves 134, 135 show that signal levels will go from high to low relatively fast, but due to the relatively large RC time constant provide by the capacitive and resistive loading, the time for recovery to a relatively high signal level is rather substantial. However, using the present invention provides adequate wait times between drawing KEYIN and KEYOUT lines to respective levels to accommodate the curves 134, 135 so that voltage levels stabilize before checking to determine whether one or more keys have been pushed, e.g., in the manner described above. Wait times of from about 1 millisecond to about 4 milliseconds have been found acceptable for signals to stabilize when going from relatively low to relatively higher voltage levels. Longer or shorter wait times may be used, as long as suitable stabilization has occurred. Using the invention, though, suitable stabilizing at relatively low voltage levels occurs in as short as 20 nanoseconds (ns). If the voltage levels have not suitably stabilized, the false detecting of ghost keys may occur. A ghost key is a key that appears to be detected as pushed, but it actually is not pushed.

The actual time needed to detect a pushed key among a group of keys, e.g., a group of keys of a respective row $R_1$, $R_2$, $R_3$, after the circuitry has stabilized may be as short as a number of nanoseconds, e.g., on the order of about 20 nanoseconds or slower or faster, but in any event much faster that the duration of the wait time mentioned herein. While the keyboard matrix 17m is stabilizing, e.g., during a wait time, the processor 31 may be in a low power mode, as it does not have to do any work, thus saving power; or the processor may be used to perform functions other than detecting a pushed key, thus improving efficient use of the processor.

As was mentioned above, the above-described operation of the keyboard matrix portion 17m is exemplary of operation of the full keyboard matrix 70. Such operation of the invention, including the keyboard matrix 70, the control circuit 30, software included in the control circuit and/or in the memory 33, is further described below with reference to the logic diagram or flow chart 140 shown in FIG. 8. Such operation is similar to that described above with respect to the keyboard matrix portion 17m.

In the keyboard matrix 70 there are five KEYOUT connections or lines 50-54 to the ASIC 32. A keyboard matrix may have more or fewer KEYOUT lines.

At block 141 the keyboard matrix 70 is at rest. All of the five KEYOUT lines 50-54 are at relatively low signal levels and all of the six KEYIN lines 60-65 are at relatively high signal levels.

At block 142 the Xth KEYOUT is set to the first KEYOUT. It does not necessarily matter which is the first KEYOUT, although usually the first KEYOUT always will be the same, and the other KEYOUTs will follow sequentially or in some desired order. Thus, for the immediate example, the first KEYOUT may be KEYOUT line or connection 50 (FIG. 2).

At block 143 an inquiry is made whether a key is pushed. Determining whether a key is pushed may be according to the process described above with respect to key 17-0 in FIG. 2. If the answer is no, then loop line 144 is followed back to block 141. If a key is pushed, it causes an interrupt signal to be provided the ASIC 32, and then the following steps beginning at block 145 are taken to determine which key is pushed. Signals provided the ASIC 32 also may be provided the processor 31 and/or other parts of the control circuit 30.

At block 145 all KEYOUT lines 50-54 are drawn to a relatively high signal level.

Then at block 146 a wait is instituted for a desired wait time, e.g., from about 1 millisecond to about 4 milliseconds. The wait time provides for circuit stabilization, for example, after a signal across a capacitive load has been changed, e.g. from a low to a high level.

At block 147 the Xth KEYOUT is drawn to a relatively low signal level. Then, at block 148, while the Xth KEYOUT remains at the relatively low signal level, all of the KEYIN lines 60-65 are sampled at the same time when the signal on such KEYIN lines is expected to be low. If one or more KEYIN lines is at a relatively high signal level, this information provided to the ASIC 32 is in a sense coordinated with which Xth KEYOUT line is at the low signal level to determine which of the keys is/are pressed.

At block 149 all the KEYOUT signal levels are drawn to a relatively high signal level, and then there is a wait period at block 150, e.g., similar to the wait period at block 146, to provide for circuitry and signal stabilizing.

After the wait period has expired or timed out, then at block 151 the value of X representing the Xth KEYOUT is increased by one.

At block 152 an inquiry is made whether X is greater than the Y total number of KEYOUTS. If no, then at block 153 the above process is repeated, as follows. For example, at block 153 the Xth KEYOUT is drawn to a relatively low signal level. Then, at block 154 all KEYIN lines 60-65 are sampled at the same time when they are expected to be at relatively low signal level. If a KEYIN signal level is at a relatively high signal level, then that information is coordinated by the ASIC 32 and the processor with the Xth KEYOUT to identify which of the keys is pushed, as was mentioned above.

Line 155 then is followed back to block 149 and the steps 150 through 154 are followed again until the value X (representing the number of the KEYOUT) exceeds the total number of KEYOUTs Y. If this occurs as detected at block 152, then line 156 is followed back to block 143. The flow chart logic diagram then continues as described above.

As one example, the process to sample or scan all of the groups of keys in the manner described above, may be repeated every 28 milliseconds, which usually is adequately frequently to detect keys being pressed and adequately slow to allow for resting or other uses of the processor, etc., e.g., during wait times.

Figure 8:
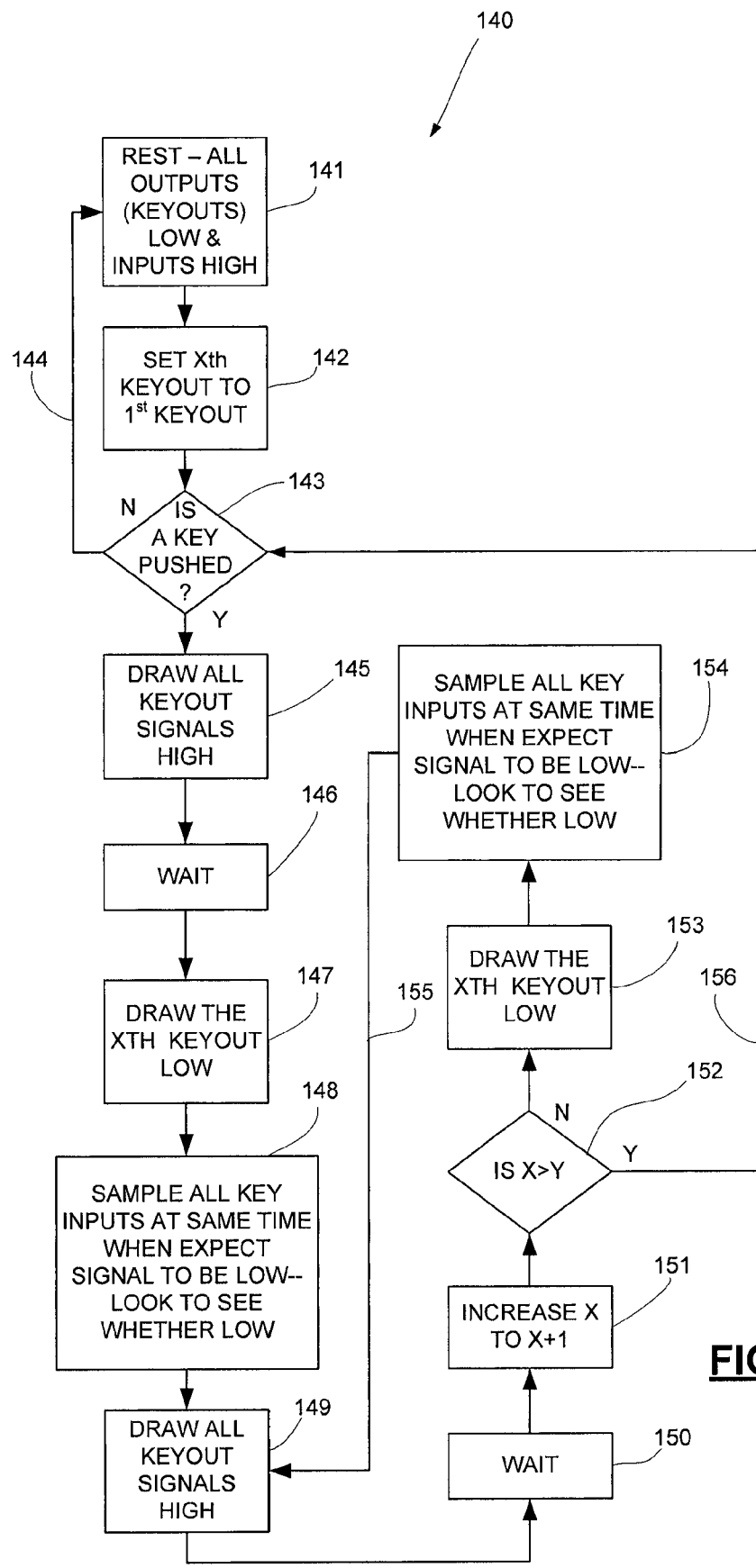
FIG. 8 is a functional block diagram of logic or computer program flow chart illustrating a method in accordance with an embodiment of the invention.

The above-described logic diagram 140 of FIG. 8 is exemplary. The mobile phones 10, 10' and the operating circuitry 30 with the features described herein may be operated in many different ways to obtain the functions and advantages described herein.

It will be appreciated that portions of the present invention can be implemented in hardware, software, firmware, or a combination thereof. In the described embodiment(s), a number of the steps or methods may be implemented in software or firmware that is stored in a memory and that is executed by a suitable instruction execution system. If implemented in hardware, for example, as in an alternative embodiment, implementation may be with any or a combination of the following technologies, which are all well known in the art: discrete logic circuit(s) having logic gates for implementing logic functions upon data signals, application specific integrated circuit(s) (ASIC) having appropriate combinational logic gates, programmable gate array(s) (PGA), field programmable gate array(s) (FPGA), etc.

Any process or method descriptions or blocks in flow charts may be understood as representing modules, segments, or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

The logic and/or steps represented in the flow diagrams of the drawings, which, for example, may be considered an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The above description and accompanying drawings depict the various features of the invention. It will be appreciated that the appropriate computer code could be prepared by a person who has ordinary skill in the art to carry out the various steps and procedures described above and illustrated in the drawings. It also will be appreciated that the various terminals, computers, servers, networks and the like described above may be virtually any type and that the computer code may be prepared to carry out the invention using such apparatus in accordance with the disclosure hereof.

Specific embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

Although certain embodiments have been shown and described, it is understood that equivalents and modifications falling within the scope of the appended claims will occur to others who are skilled in the art upon the reading and understanding of this specification.

What is claimed is:

1. A method of scanning a keyboard matrix of a wireless portable communication device that has a plurality of keys that are selectively operable to respective conditions to provide respective electrical signals, comprising attempting to selectively draw the plurality of keys substantially simultaneously to a specified condition, wherein the specified condition is associated with the status of circuitry associated with the plurality of keys;

sampling at least a group of the keys substantially simultaneously to determine whether any of the keys is at a condition different from the specified condition, and wherein the number of keys in the group is less than the number of keys in the plurality of keys, repeating the attempting step for the plurality of keys and the sampling step for at least a further group of keys, wherein the further group of keys includes at least one key different from the first mentioned group of keys and wherein the number of keys in the further group is less than the number of keys in the plurality of keys; and wherein at least part of the keyboard matrix is in proximity to an antenna of a wireless portable communication device, and further comprising decoupling interaction between at least one or more keys of the group of keys from interference with antenna operation by directing signals associated with said one or more keys of the group of keys in a resistor and capacitor circuit.

2. The method of claim 1, said attempting comprising drawing to a relatively high voltage level.

3. The method of claim 1, wherein said sampling comprises drawing the group of keys to a relatively low voltage level, and determining whether any of the keys of the group is at a high voltage level as a representation of being selectively operated.

4. The method of claim 1, wherein the keyboard matrix comprises a two dimensional x by y matrix of keys, and wherein said sampling comprises drawing to a relatively low voltage level a group of keys represented in one dimension and at one location in the other dimension of the two dimensional matrix and determining whether any of the keys in such other dimension is at other than a relatively low voltage level.

5. The method of claim 1, further comprising sensing the operation of at least one key to provide an interrupt signal to initiate the attempting, sampling and repeating steps.

6. The method of claim 1, wherein circuitry including respective keys have a resistance and capacitance time constant function, and the method further comprising providing a wait period of time between said attempting and sampling steps to allow substantial stabilizing of electrical signals occurring during the attempting step.

7. The method of claim 6, wherein the providing a wait period comprises providing a wait period of a duration from about one millisecond to about four milliseconds.

8. The method of claim 1, wherein said repeating comprises repeating the attempting and sampling steps until the attempting and sampling steps have been carried out for all of the plurality of keys.

9. The method of claim 1, wherein the keyboard is included in a wireless communication device having a processor, and further comprising at least partly controlling by the processor the steps of attempting, sampling and repeating until all of the plurality of keys have been scanned, and wherein the sum of incremental time of operation of the processor to carry out the steps of attempting, sampling and repeating to complete a scan of all of the plurality of keys, excluding any wait time provided while signals are stabilizing, is less that the total time for attempting, sampling, repeating and any wait times to complete a scan of all the plurality of keys, and further comprising permitting the processor to go to a rest state or to carry out another function while not carrying out the steps of attempting, sampling and repeating.

10. The method of claim 1, wherein the keyboard matrix is coupled to logic circuitry, and wherein said attempting and sampling include receiving output signals from the logic circuitry and said sampling further comprises providing to the logic circuitry input signals representative of respective selectively operated keys.

11. The method of claim 1, wherein the keyboard matrix is included in a mobile phone wireless portable communication device, and further comprising pressing one or more of the plurality of keys to carry out functions of the mobile phone.

12. A keyboard apparatus for a wireless communication device that has an antenna function, comprising,
a plurality of keys selectively operable to provide respective inputs for the wireless communication device,
circuitry coupled to respective keys and configured to provide respective signals to the keys to determine whether a key is operated to provide an input for the wireless communication device, and
wherein the plurality of keys are capable of being selectively drawn substantially simultaneously to a specified condition, wherein the specified condition is associated with the status of circuitry associated with the plurality of keys;
at least a group of the keys configured to be sampled substantially simultaneously to determine whether any of the keys is at a condition different from the specified condition;
wherein the number of keys in the group is less than the number of keys in the plurality of keys; and
wherein at least part of the keyboard matrix is in proximity to an antenna of a wireless portable communication device, and further comprising a resistor capacitor circuit configured to provide decoupling interaction between at least one or more keys of the group of keys from interference with antenna operation by directing signals associated with said one or more keys of the group of keys in the resistor and capacitor circuit.

13. The apparatus of claim 12, wherein the keys are coupled in a circuit forming a two dimensional x by y matrix.

14. The apparatus of claim 13, wherein said circuitry is configured to draw to a relatively low voltage level a group of keys represented in one dimension of the matrix and at one location in the other dimension of the matrix and said circuitry further configured to determine whether any of the keys in such other dimension is at other than a relatively low voltage level.

15. The apparatus of claim 12, wherein each key has two electrically conductive terminals and a movable member responsive to selective operation of the key to provide electrical connection between said two electrically conductive terminals, and said at least one resistor comprising one resistor coupled electrically to one of said terminals of one or more keys of a respective group of keys and one resistor coupled electrically to a second terminal of the said key of a respective group of keys, at least one of the resistors being coupled with a capacitor to provide a resistor capacitor circuit to smooth changes in the signals occurring in response to opening or closing a circuit between said terminals by the movable member to reduce affect on the antenna function.

16. The apparatus of claim 12, wherein said circuitry includes logic operable to scan the keys by attempting to selectively draw the plurality of keys substantially simultaneously to a specified condition, wherein the specified condition is associated with the status of a circuit associated with the plurality of keys;
sampling at least a group of the keys substantially simultaneously to determine whether any of the keys is at a condition different from the specified condition, and
repeating the attempting step for the plurality of keys and the sampling step for at least a further group of keys,
wherein the further group of keys includes at least one key different from the first mentioned group of keys and wherein the number of keys in the further group is less than the number of keys in the plurality of keys.

17. The apparatus of claim 16, wherein the keyboard is included in a wireless communication device having a processor and a program storage device containing operative code for operating the processor and the keyboard, and wherein the operative code is configured to respond to an interrupt signal caused by selective operation of at least one key to control the processor to carry out the steps of attempting, sampling and repeating until all of the plurality of keys have been scanned, and wherein the sum of incremental time of operation of the processor to carry out the steps of attempting, sampling and repeating to complete a scan of all of the plurality of keys, excluding any wait time provided while signals are stabilizing is less that the total time for attempting, sampling, repeating and any wait times to complete a scan of all the plurality of keys, and wherein the processor is permitted to go to a rest state or to carry out another function while not carrying out the steps of attempting, sampling and repeating.

18. A non-transitory computer readable storage medium comprising a computer program comprising instructions, which when executed on a processor cause the processor to perform scanning of a keyboard matrix to sense selective operation of one or more keys of the keyboard matrix, comprising attempting to selectively draw a plurality of keys substantially simultaneously to a specified condition, wherein the specified condition is associated with the status of a circuit associated with the plurality of keys;

sampling at least a group of the keys substantially simultaneously to determine whether any of the keys is at a condition different from the specified condition, and wherein the number of keys in the group is less than the number of keys in the plurality of keys, repeating the attempting step for the plurality of keys and the sampling step for at least a further group of keys, wherein the further group of keys includes at least one key different from the first mentioned group of keys and wherein the number of keys in the further group is less than the number of keys in the plurality of keys; and wherein at least part of the keyboard matrix is in proximity to an antenna of a wireless portable communication device, and further comprising decoupling interaction between at least one or more keys of the group of keys from interference with antenna operation by directing signals associated with said one or more keys of the group of keys in a resistor and capacitor circuit.

\* \* \* \* \*